(12) United States Patent
Hashimoto et al.

(10) Patent No.: US 7,642,325 B2
(45) Date of Patent: Jan. 5, 2010

(54) NON-STICKY WATER-BASED CONFORMAL COATING MATERIAL

(75) Inventors: Masashi Hashimoto, Sakai (JP); Hideo Maeda, Ibaraki-ken (JP)

(73) Assignee: Tohpe Corporation, Osaka-fu (JP)

( * ) Notice: Subject to any disclaimer, the term of this patent is extended or adjusted under 35 U.S.C. 154(b) by 447 days.

(21) Appl. No.: 11/399,468

(22) Filed: Apr. 7, 2006

(65) Prior Publication Data

US 2006/0178479 A1    Aug. 10, 2006

Related U.S. Application Data

(62) Division of application No. 10/954,273, filed on Oct. 1, 2004, now abandoned.

(30) Foreign Application Priority Data

Oct. 3, 2003  (JP)  ............................. 2003-345953

(51) Int. Cl.
*C08F 118/02*  (2006.01)
*B05D 5/12*  (2006.01)

(52) U.S. Cl. ....................... 526/213; 526/319; 526/346; 525/222; 525/85; 525/148; 525/308; 427/96.1; 427/96.2; 427/407.1

(58) Field of Classification Search ................. 525/222, 525/85, 148, 308, 330.3; 524/560, 561, 501, 524/523; 523/201; 428/65.1; 427/96, 407.1, 427/96.1, 96.2; 526/213, 319, 346

See application file for complete search history.

(56) References Cited

U.S. PATENT DOCUMENTS

| 3,454,516 | A | | 7/1969 | Victorius |
| 3,973,321 | A | * | 8/1976 | Horton ........................ 29/602.1 |
| 6,066,693 | A | * | 5/2000 | Fischer et al. .................. 525/67 |
| 6,395,836 | B1 | | 5/2002 | Shinoda |

FOREIGN PATENT DOCUMENTS

| CN | 1192755 A | 9/1998 |
| JP | 2002-146266 | 5/2002 |

OTHER PUBLICATIONS

Chinese Office Action dated Sep. 7, 2007.

* cited by examiner

*Primary Examiner*—Ling-Siu Choi
(74) *Attorney, Agent, or Firm*—Antonelli, Terry, Stout & Kraus, LLP.

(57) ABSTRACT

A non-sticky water-based coating material in the form of a film applied to the face of a circuit board that is loaded with electronic parts; which comes into contact with the outside environment. The coating material can be formed into the film at room temperature without using a coalescence, does not contain a solvent and forms a membrane having flexibility, low Young's modulus, favorable adhesive properties, moisture resistance and insulating properties. Specifically, the non-sticky water-based conformal coating material includes a resin wherein a flexible acrylic resin having glass transition temperature of at most 0° C. is the main chain and a vinyl polymer having a glass transition temperature of at least 20° C. is grafted to the flexible acrylic resin; the content of the vinyl polymer being 10 to 70% by weight based on the flexible acrylic resin.

2 Claims, No Drawings

NON-STICKY WATER-BASED CONFORMAL COATING MATERIAL

CROSS REFERENCE TO RELATED APPLICATION

This application is a divisional application of application Ser. No. 10/954,273, filed Oct. 1, 2004, now abandoned, the disclosure of which is hereby incorporated by reference.

BACKGROUND OF THE INVENTION

The present invention relates to a conformal coating material (hereinafter referred to as coating material) that forms an insulating moisture-proof membrane, in which cracking and peeling from the substrate tend not to occur and which does not apply excessive stress to the lead pin of electronic parts.

Due to widespread use of computers, circuit boards loaded with electronic parts have come to be used in household electric products and automobiles. Also, solvent coating materials having moisture resistance and insulating properties have come to be applied, in order to protect circuit boards from sudden temperature change, humidity, water and dust.

In recent years, along with increase in social awareness regarding environmental problems, a coating material has been developed, in which ethyl acetate, methyl acetate and butyl acetate are used instead of aromatic hydrocarbon solvents such as toluene and xylene, which are high in toxicity (see JP-A-2002-146266). However, this coating material lets out a great deal of solvent when applied and therefore, has many problems such as danger of fire, foul odor generated by the evaporated solvent and health management of workers to poisoning. Furthermore, depending on the locational conditions of the working area, measures against the Foul Smell Control Law may become necessary.

Also, water-based coating materials that do not contain a solvent have been considered. However, because film-forming properties and durability of the coating film are not sufficient, at present, coating materials contain 5 to 10% of a solvent. In such water-based coating materials containing a solvent, when the Young's modulus is low, the membrane remains sticky and problems occur, such as adhesion of dirt and blocking when handling. Also, coating materials having less stickiness are not sufficient, as these have large Young's modulus and apply large load to the substrate. As a result, peeling of solder and deformation of the lead pin may occur, due to expansion and contraction of the membrane caused by increase and decrease in the environmental temperature.

SUMMARY OF THE INVENTION

The present invention aims to provide a non-sticky water-based coating material that solves the above problems and forms a membrane having favorable adhesive properties, moisture resistance and insulating properties.

As a result of intensive studies to solve the above problems, by grafting a hard resin having high glass transition temperature (hereinafter referred to as Tg) to an acrylic resin main chain having low Tg and high flexibility, a non-sticky water-based coating material, which does not contain a solvent and has small Young's modulus and large insulation resistance, has been successfully developed.

That is, the present invention relates to a non-sticky water-based conformal coating material comprising a resin wherein a flexible acrylic resin having glass transition temperature of at most 0° C. is the main chain and a vinyl polymer having a glass transition temperature of at least 20° C. is grafted to the flexible acrylic resin; the content of the vinyl polymer being 10 to 70% by weight based on the flexible acrylic resin.

DETAILED DESCRIPTION

The coating material of the present invention is a conformal coating material that is applied to the face of a circuit board that is loaded with electronic parts, which comes into contact with the outside environment. Herein, conformal coating refers to a coating for providing moisture resistance and insulation of a circuit board.

The coating material can be formed into a film at room temperature without using a coalescence, because the acrylic resin that composes the main chain has low Tg of at most 0° C. Also, the coating material does not cause peeling of solder and deformation of the lead pin of the substrate due to expansion and contraction when heating or cooling, as the membrane obtained therefrom is flexible and has low Young's modulus and small contraction stress after being formed into a film. The upper limit of Tg of the above acrylic resin is 0° C., preferably −5° C. and the lower limit is preferably −55° C., more preferably −35° C. When Tg is higher than 0° C., film-forming properties are poor and flexibility decreases when applied under low temperatures.

Also, a coating material obtained by graft polymerizing monomers that form a vinyl polymer (hard resin) having high Tg of at least 20° C. and excellent water resistance does not have the surface stickiness of flexible resin, does not collect dust and exhibits excellent moisture resistance.

The upper limit of Tg of the above vinyl polymer is preferably 150° C., more preferably 120° C. and the lower limit is 20° C., preferably 50° C. When Tg is lower than 20° C., controlling the stickiness of the membrane surface is difficult and dust may adhere.

The non-sticky water-based coating material of the present invention is obtained by first, polymerizing the flexible acrylic monomer in a water-based medium and then, graft polymerizing a monomer that forms hard resin with the flexible acrylic resin, in an amount that is suitable depending on the composition of the acrylic resin. The non-sticky water-based coating material can be formed into a film at room temperature without using a coalescence and the film obtained therefrom is flexible, has low Young's modulus and is excellent in insulating properties and moisture resistance. Usually, when stickiness is improved, that is stickiness is decreased, the Young's modulus becomes extremely high and high stress is applied to solder of the substrate and lead pins.

As the flexible acrylic resin, polymers of at least one kind of alkyl acrylate or alkoxy acrylate or copolymers composed mainly of these monomers, to which other acrylate or vinyl monomers having high Tg, within the range that Tg is at most 0° C., are copolymerized, can be used. Specific examples are methyl acrylate, ethyl acrylate, propyl acrylate, butyl acrylate, pentyl acrylate, hexyl acrylate, 2-ethylhexyl acrylate, octyl acrylate, nonyl acrylate, decyl acrylate, isobutyl acrylate, isomyristyl acrylate, lauryl acrylate, methoxyethyl acrylate, ethoxyethyl acrylate, butoxyethyl acrylate and ethoxypropyl acrylate. Examples of the other acrylate or vinyl monomer having high Tg are methyl methacrylate, ethyl methacrylate, butyl methacrylate, tertial butyl methacrylate, cyclohexyl methacrylate, cyclohexyl acrylate, 2-ethylhexyl methacrylate, methoxyethyl methacrylate, ethoxyethyl methacrylate and butoxyethyl methacrylate. Of these, from the viewpoints of reactivity, storage stability and weather resistance, a system in which alkyl acrylate is the main component and alkyl methacrylate is added, with Tg of at most 0° C., is preferable.

As a grafting agent, acrylate containing an unsaturated group can be used, such as dicyclopentenyl (meth)acrylate, cyclopentenyloxyethyl (meth)acrylate and dihydrodicyclopentenyl (meth)acrylate. Of these, in view of reactivity and graft efficiency, cyclopentenyloxyethyl acrylate is preferable.

The amount of the grafting agent is preferably 1 to 10% by weight based on the flexible acrylic resin. When the amount of the grafting agent is less than 1% by weight based on the flexible acrylic resin, the number of graft sites is too small and stickiness may remain. When the amount is more than 10% by weight, the properties of the membrane tend to degrade.

Examples of the monomer that graft polymerizes with the flexible acrylic resin and forms hard resin are styrene, α-methylstyrene, methyl methacrylate, butyl methacrylate, tertial butyl methacrylate, acrylonitirile, methacrylonitrile, cyclohexyl methacrylate and cyclohexylacrylate. Of these, in view of water resistance, weather resistance and thermal discoloring resistance, styrene is preferable.

The content of hard resin is 10 to 70% by weight based on the flexible acrylic resin and can be suitably selected within the above range, according to the composition of the flexible acrylic resin and hard resin which are to be combined. More preferably, the content is 20 to 50% by weight. When the content is less than 10% by weight, surface stickiness remains and when the content is more than 70% by weight, film-forming properties are poor and cracks tend to develop in the membrane surface.

As the polymerization initiator, aqueous azo compounds can be used, such as V-30, V-50, VA-545, VA546, VA041 and VA-044 (all available from Wako Pure Chemical Industries, Ltd.). From the viewpoint of reactivity and storage stability, V-50 is preferable.

When conducting polymerization, a surfactant is used. As the surfactant, common surfactants such as polyoxyethylene alkyl ether, polyoxyethylene styrenated phenyl ether and polyoxyethylene polyoxypropylene block polymer can be used. However, from the viewpoint that water resistance is excellent and the surfactant does not bleed to the membrane surface, a reactive surfactant is preferable. Particularly, in view of polymerization stability and thermal discoloring resistance, ADEKA REASOAP ER-10, ER-20, ER-30 and ER-40 (all available from Asahi Denka Co., Ltd.) are preferable.

Besides the acrylic resin to which vinyl polymers are grafted, the conformal coating material of the present invention can contain other components such as water, a defoaming agent, a thickener and a leveling agent.

Hereinafter, the coating material of the present invention is explained by means of Examples.

EXAMPLE 1

20 parts by weight (hereinafter referred to as parts) of ADEKA REASOAP ER-20 (available from Asahi Denka Co., Ltd.), 150 parts of butyl acrylate, 150 parts of butyl methacrylate, 16 parts of cyclopentenyloxyethyl acrylate, 2 parts of acrylic acid, 1 part of V-50 (available from Wako Pure Chemical Industries, Inc.) and 200 parts of deionized water were processed in a homomixer to obtain an emulsion.

A colben was charged with 350 parts of deionized water and after the temperature was adjusted to 70° C., 10% of the above emulsion was added to start the reaction. Thereafter, the temperature was adjusted to 80° C. and the rest of the emulsion was dropped over 120 minutes. The Tg of the obtained acrylic resin was −19° C.

For 30 minutes after dropping, the temperature was maintained at 80° C. Then, 0.2 part of V-50 was added and reaction was conducted while dropping 80 parts of styrene over 60 minutes. The temperature was maintained at 80° C. for 60 minutes to finish the reaction and after cooling, the pH was adjusted with 1 part of 28% ammonium water and 34.8 parts of deionized water to obtain a graft copolymer. The styrene resin content of the obtained graft copolymer was 25.2% by weight based on the acrylic resin. The Tg of polystyrene was 100° C.

EXAMPLE 2

20 parts of ADEKA REASOAP ER-20, 150 parts of butyl acrylate, 150 parts of butyl methacrylate, 16 parts of cyclopentenyloxyethyl acrylate, 2 parts of acrylic acid, 1 part of V-50 and 200 parts of deionized water were processed in a homomixer to obtain an emulsion.

A colben was charged with 350 parts of deionized water and after the temperature was adjusted to 70° C., 10% of the above emulsion was added to start the reaction. Thereafter, the temperature was adjusted to 80° C. and the rest of the emulsion was dropped over 120 minutes. The Tg of the obtained acrylic resin was −19° C.

For 30 minutes after dropping, the temperature was maintained at 80° C. Then, 0.2 part of V-50 was added and reaction was conducted while dropping 40 parts of styrene over 60 minutes. The temperature was maintained at 80° C. for 60 minutes to finish the reaction and after cooling, the pH was adjusted with 1 part of 28% ammonium water and 34.8 parts of deionized water to obtain a graft copolymer. The styrene resin content of the obtained graft copolymer was 12.6% by weight based on the acrylic resin.

EXAMPLE 3

20 parts of ADEKA REASOAP ER-20, 150 parts of butyl acrylate, 150 parts of butyl methacrylate, 16 parts of cyclopentenyloxyethyl acrylate, 2 parts of acrylic acid, 1 part of V-50 and 200 parts of deionized water were processed in a homomixer to obtain an emulsion.

A colben was charged with 350 parts of deionized water and after the temperature was adjusted to 70° C., 10% of the above emulsion was added to start the reaction. Thereafter, the temperature was adjusted to 80° C. and the rest of the emulsion was dropped over 120 minutes. The Tg of the obtained acrylic resin was −19° C.

For 30 minutes after dropping, the temperature was maintained at 80° C. Then, 0.2 part of V-50 was added and reaction was conducted while dropping 160 parts of styrene over 60 minutes. The temperature was maintained at 80° C. for 60 minutes to finish the reaction and after cooling, the pH was adjusted with 1 part of 28% ammonium water and 34.8 parts of deionized water to obtain a graft copolymer. The styrene resin content of the obtained graft copolymer was 50.3% by weight based on the acrylic resin.

COMPARATIVE EXAMPLE 1

20 parts of ADEKA REASOAP ER-20, 150 parts of butyl acrylate, 150 parts of butyl methacrylate, 80 parts of styrene, 16 parts of cyclopentenyloxyethyl acrylate, 2 parts of acrylic acid, 1 part of V-50 and 200 parts of deionized water were processed in a homomixer to obtain an emulsion.

A colben was charged with 350 parts of deionized water and after the temperature was adjusted to 70° C., 10% of the above emulsion was added to start the reaction. Thereafter, the temperature was adjusted to 80° C. and the rest of the emulsion was dropped over 150 minutes. The temperature was maintained at 80° C. for 60 minutes to finish the reaction and after cooling, the pH was adjusted with 1 part of 28% ammonium water and 30 parts of deionized water to obtain a random copolymer.

The cured membranes obtained using the above copolymers were evaluated in the following manner. Unless indicated otherwise, measurement was conducted under an environment of 23° C. and 50% RH.

(1) Film-Forming Temperature

The coating material was tested in the range of −10 to 50° C. by a temperature gradient testing machine (made by Tester Sangyo Co., Ltd.) and the minimum temperature at which a normal film is formed was measured.

(2) Tensile Strength, Elongation and Young's Modulus

The sample was applied by an applicator to prepare a film having thickness of 80 to 90 μm. Tensile strength, elongation and Young's modulus of a die-cut specimen were measured using an all-purpose tensile and compression testing machine (made by Minebea Co., Ltd.), under the conditions of pulling speed rate of 100 mm/minute for tensile strength and elongation and 1 mm/minute for Young's modulus.

(3) Insulation Resistance

The sample was applied to JIS II model comb-type substrate and after drying for 30 minutes at 90° C., the insulation resistance was measured by applying DC. 100 V using a high-resistance tester (made by Yokogawa Hewlett Packard, Ltd.).

(4) Insulating Properties in High Temperature and High Humidity

The sample was applied to JIS II model comb-type substrate and dried for 30 minutes at 90° C. The specimen was placed in a constant temperature and humidity chamber (atmosphere inside chamber: 85° C., 85 to 90% RH) and after 168 hours, the insulation resistance was measured by applying DC. 100 V using a high-insulation measuring machine (made by Yokogawa Hewlett Packard, Ltd.).

(5) Non-Stickiness

The sample was flow-coated on a glass board and dried for 30 minutes at 90° C. to obtain a membrane. The membrane was evaluated by touch as ◯ when the membrane did not feel sticky, Δ when the membrane felt somewhat sticky but was not largely distorted and X when the membrane felt sticky.

(6) Adhesive Properties

The membrane formed on the JIS II model comb-type substrate was tested by the 1 mm spacing cross-cut test method (according o JIS K5600-5-6) and the number of remaining squares that were not flaked was represented in a number value. The number of squares that were cut was 100.

The evaluation results are shown in Table 1.

TABLE 1

| | Ex. 1 | Ex. 2 | Ex. 3 | Com. Ex. 1 |
|---|---|---|---|---|
| Film-forming temperature (° C.) | <0 | <0 | <0 | <0 |
| Tensile strength (MPa) | 5.6 | 1.8 | 7.6 | 7.8 |
| Elongation (%) | 385 | 520 | 285 | 360 |
| Non-stickiness | ◯ | Δ | ◯ | X |
| Insulating properties (Ω) | $1.9 \times 10^{11}$ | $2.6 \times 10^{11}$ | $2.7 \times 10^{11}$ | $7.0 \times 10^{10}$ |
| Insulating properties in high humidity (Ω) | $5.8 \times 10^{9}$ | $2.6 \times 10^{9}$ | $5.4 \times 10^{9}$ | $1.1 \times 10^{9}$ |
| Young's modulus (MPa) | 1.2 | 0.4 | 20.2 | 17.6 |
| Adhesive properties | 100/100 | 100/100 | 100/100 | 100/100 |

The resin of Comparative Example 1 obtained by random polymerization, in which the hard resin was not grafted to the flexible acrylic resin main chain by two-step polymerization, tends to exhibit stickiness, although the composition is the same, and also, the Young's modulus tends to be high.

The coating material of the present invention can be formed into a film at room temperature without using a coalescence, does not contain a solvent and forms a membrane having flexibility, low Young's modulus, favorable adhesive properties, moisture resistance and insulating properties.

What is claimed is:

1. A method for preparing a circuit board, which comprises the step of applying and curing a non-sticky water-based conformal coating material to the surface of a circuit board that is loaded with electronic parts, which comes into contact with outside environment, to form a conformal coating on the circuit board in the form of a cured film membrane,
   wherein the coating material comprises a resin wherein a flexible acrylic resin having glass transition temperature of at most 0° C. is the main chain and a vinyl polymer having a glass transition temperature of at least 20° C. is grafted to said flexible acrylic resin;
   the content of said vinyl polymer being 10 to 70% by weight based on said flexible acrylic resin.

2. A non-sticky water-based conformal coating material on the face of a circuit board that is loaded with electronic parts, which comes into contact with the outside environment, the coating material being in the form of a conformal cured film membrane on the face of the circuit board, wherein the coating material comprises a resin wherein a flexible acrylic resin having glass transition temperature of at most 0° C. is the main chain and a vinyl polymer having a glass transition temperature of at least 20° C. is grafted to said flexible acrylic resin;
   the content of said vinyl polymer being 10 to 70% by weight based on said flexible acrylic resin.

* * * * *